United States Patent
Shyu et al.

(10) Patent No.: US 9,182,681 B2
(45) Date of Patent: Nov. 10, 2015

(54) METHOD AND SYSTEM FOR MEASURING A STACKING OVERLAY ERROR BY FOCUSING ON ONE OF UPPER AND LOWER LAYER OVERLAY MARKS USING A DIFFERENTIAL INTERFERENCE CONTRAST MICROSCOPE

(71) Applicant: Industrial Technology Research Institute, Hsinchu (TW)

(72) Inventors: Deh-Ming Shyu, Miaoli County (TW); Yi-Sha Ku, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 193 days.

(21) Appl. No.: 13/726,409

(22) Filed: Dec. 24, 2012

(65) Prior Publication Data
US 2014/0118721 A1    May 1, 2014

(30) Foreign Application Priority Data
Nov. 1, 2012    (TW) .............................. 101140550 A

(51) Int. Cl.
*G01B 9/02* (2006.01)
*G03F 7/20* (2006.01)

(52) U.S. Cl.
CPC .................................. *G03F 7/70633* (2013.01)

(58) Field of Classification Search
CPC .... G01D 5/347; G01B 11/14; G01B 9/02028; G01B 9/02019
USPC .......................................... 356/490, 493, 508
See application file for complete search history.

(56) References Cited

U.S. PATENT DOCUMENTS

| | | | |
|---|---|---|---|
| 6,710,876 B1 * | 3/2004 | Nikoonahad et al. | 356/401 |
| 7,375,810 B2 | 5/2008 | Nikoonahad et al. | |
| 8,189,202 B2 | 5/2012 | Liesener et al. | |
| 8,248,617 B2 | 8/2012 | De Groot et al. | |
| 2006/0023225 A1 * | 2/2006 | Tobben et al. | 356/497 |
| 2010/0271621 A1 * | 10/2010 | Levy et al. | 356/73 |
| 2011/0200246 A1 | 8/2011 | Van De Kerkhof et al. | |
| 2012/0162647 A1 | 6/2012 | Li | |

OTHER PUBLICATIONS

Metrology and Inspection for Process Control During Bonding and Thinning of Stacked Wafers for Manufacturing 3D SIC' s, Sandip Halder, Anne Jourdain, Martine Claes,Ingrid de Wolf,Youssef Travaly,Eric Beyne, Bart Swinnen, Electronic Components andTechnology Conference, 2011, p. 999-p. 1002.

(Continued)

*Primary Examiner* — Hwa Lee
(74) *Attorney, Agent, or Firm* — Lin & Associates IP, Inc.

(57) ABSTRACT

According to one embodiment of a method for measuring a stacking overlay error, the method may use a differential interference contrast microscope system to measure a stacking overlay mark and focus on one overlay mark of a lower layer overlay mark and an upper layer overlay mark when measuring the stacking overlay mark. Then, the method uses an image analysis scheme to obtain an image of the stacking overlay mark from a photo-detector and obtains a first reference position of the lower layer overlay mark in a direction and a second reference position of the upper layer overlay mark in the direction from the image; and computes the stacking overlay error in the direction according to the first and the second reference positions.

4 Claims, 16 Drawing Sheets

(56) References Cited

OTHER PUBLICATIONS

Wafer-to-Wafer Alignment for Three-Dimensional Integration: A Review, Sang Hwui Lee, Kuan-NengChen, Lu, J.J.-Q. Microelectromechanical Systems , 2011,Journal of Microelectromechanical Systems, vol. 20, No. 4, Aug. 2011, p. 885-p. 898.

Infrared Microscopy for Overlay and Defect Metrology on 3D-Interconnect Bonded Wafers, Lay Wai Kong,Greg G. Baker, IEEE 2010, p. 347-p. 352.

Post-bond sub-500 nm alignment in 300 mm integrated face-to-face wafer-to-wafer Cu-Cu thermocompression, Si-Si fusion and oxideoxide fusion bonding, Teh, W.H., Deeb, C., Burggraf, J., Arazi, D., Young, R., Senowitz, C., Buxbaum, A. 3D Systems Integration Conference (3DIC), 2010 IEEE International, 2010, p. 1-p. 6.

Recent advances in submicron alignment 300 mm copper-copper thermocompressive face-to-face wafer-to-wafer bonding and integrated infrared, high-speed FIB metrology, Teh, W.H.,Deeb, C. ; Burggraf, J.; Wimplinger, M. Interconnect Technology Conference (IITC), 2010, p. 6-p. 9.

Pre bonding metrology solutions for 3D integration, Riou, G.,Gaudin, G. ; Landru, D. ; Tempesta, C. ; Radu, I. ; Sadaka, M. ; Winstel, K. ; Kinser, E., 3D Systems Integration Conference (3DIC), 2010 IEEE International, 2010, p. 16-p. 18.

* cited by examiner

METHOD AND SYSTEM FOR MEASURING A STACKING OVERLAY ERROR BY FOCUSING ON ONE OF UPPER AND LOWER LAYER OVERLAY MARKS USING A DIFFERENTIAL INTERFERENCE CONTRAST MICROSCOPE

CROSS-REFERENCE TO RELATED APPLICATION

The present application is based on, and claims priority from, Taiwan Patent Application No. 101140550, filed Nov. 1, 2012, the disclosure of which is hereby incorporated by reference herein in its entirety.

TECHNICAL FIELD

The present disclosure relates generally to a method and system for measuring a stacking overlay error.

BACKGROUND

In the past, wafer production is made on two-dimensional (2D) space. With more wafer complexity, increasing lateral area on two-dimensional space is unable to make the Moore's Law continuingly effective. Therefore, using stacked way to integrate different wafers is developed recently. The three-dimensional integrated circuit (3DIC) is the integration mode of wafers with three-dimensional stacking overlay. The characteristics of 3DIC include connecting circuits functions made on different substrate wafers. As shown in FIG. 1, a technology uses a suitable manufacturing process to produce each of a thinned wafer 110, a thinned wafer 120, and a base wafer 130, then uses a Through-Silicon Via (TSV) technology to perform the stacked integration to shorten the metal length and the metal line resistance, thereby reducing the silicon area that may satisfy digital electronic requirements of small volume, high integration, low power consumption, low cost, and compact developed trend.

The TSV packaging technology integrates wafer stacks through a vertical conduction to make wafers electrically connected. However, good electrical interconnection should avoid producing a stacking overlay error. The stacking overlay error also affects wafer yield. When a plurality of wafers are stacked together, and measuring a stacking overlay error is very important. Three-dimensional wafer stacking methods may be divided into face-to-face, face-to-back, and back-to-back methods. Wherein the face-to face method uses inter-die via or uses micro bump for intra-die interconnection instead of using the TSV technology. The face-to-face method may only be used for two layers in the three-dimensional wafer stacking, while the remaining layers of this stacking uses the face-to-back method.

Usually, the 3D wafer stacking produces some marks used for measuring the stacking overlay. When wafers are stacked together, it may generally use bright-field optical microscope of near infrared (NIR) wavelength as a measurement tool of overlay mark. FIG. 2 shows an exemplary schematic view of an overlay mark, wherein a measurement system 200 through a prism 222 produces a structure of two light spots on a lower layer overlay mark 220 and an upper layer overlay mark 240 of a wafer, and the lower layer overlay mark 220 and the upper layer overlay make 240 are placed adjacently, and are all with a periodic grating structure. Using this overlay mark, FIG. 3A shows an exemplary schematic view for an illumination light path of a measurement system. As shown in FIG. 3A, when an incident light 334 enters into a prism, such as a Wollaston prism 320, the incident light is separated into an extraordinary ray (E-ray) 334a and an ordinary ray (O-ray) 334b; and these two rays are respectively incident to the light spot 326 of the lower layer overlay mark 220 and the light spot 328 of the upper layer overlay mark 240 via an objective lens 360.

Using the characteristics of the grating structure, the reflected light after the incident light incident on the overlay mark is divided into the +1 order and the −1 order. Wherein the reflected light of the lower layer overlay mark and the upper layer overlay mark of the +1 order is received by the detector to obtain the signal $S_{+1}$, while the reflected light of the lower layer overlay mark and the upper layer overlay mark of the −1 order is received by the detector to obtain the signal $S_{-1}$. Then, the Wollaston prism 320 moves along the y direction, the variation of the $S_{+1}$ signal and the $S_{-1}$ signal are shown in FIG. 3B. As shown in FIG. 3B, there is a shift between the $S_{+1}$ signal and the $S_{-1}$ signal, whereby the stacking overlay error of the lower layer overlay mark 220 and the upper layer overlay mark 240 of the wafers may be obtained through the shift.

Because there is a silicon wafer of a certain thickness between the upper layer overlay mark and the lower layer overlay mark of the wafer, using bright-field optical microscopy measurements may be unable to focus on the upper layer overlay mark and the lower layer overlay mark simultaneously. Therefore, separately focusing on the upper layer overlay mark and the lower layer overlay mark is required. After measuring the upper layer overlay mark and the lower layer overlay mark, the overlay error value is analyzed by software. When the focusing position of the upper layer overlay mark moves to the focusing position of the lower layer overlay mark, the introducing horizontal movement may cause a measurement error, and also increase the required measurement time. Therefore, when multiple wafers are stacked together, the accumulation of the stacking overlay error would seriously affect the wafer yield.

Therefore, it is an important issue to design a technology for measuring a stacking overlay error, without respective focusing on the upper layer overlay mark and the lower layer overlay mark when measuring, while just focusing on the lower layer overlay mark to obtain an overlay error value between the upper layer wafer and the lower layer wafer.

SUMMARY

The exemplary embodiments of the disclosure may provide a method and system for measuring a stacking overlay error.

One exemplary embodiment relates to a method for measuring a stacking overlay error. The method may comprise: using a differential interference contrast microscope system to measure a stacking overlay mark; focusing on one overlay mark of a lower layer overlay mark and an upper layer overlay mark when measuring the stacking overlay mark; using an image analysis scheme to obtain an image of the stacking overlay mark from a photo-detector and obtain a first reference position of the lower layer overlay mark in a direction and a second reference position of the upper layer overlay mark in the direction from the image; and computing a stacking overlay error in the direction according to the first and the second reference positions.

Another exemplary embodiment relates to a system for measuring a stacking overlay error. The system may comprise a differential interference contrast microscope system and an image analysis module. The differential interference contrast microscope system is configured to measure a stacking overlay mark. The image analysis module obtains an image of the stacking overlay mark from a photo-detector, and analyzes a first reference position of a lower layer overlay mark in a direction and a second reference position of an upper layer overlay mark in the direction from the image, and computes a stacking overlay error in the direction according to the first and the second reference positions.

DETAILED DESCRIPTION OF DISCLOSED EMBODIMENTS

Figure 1:
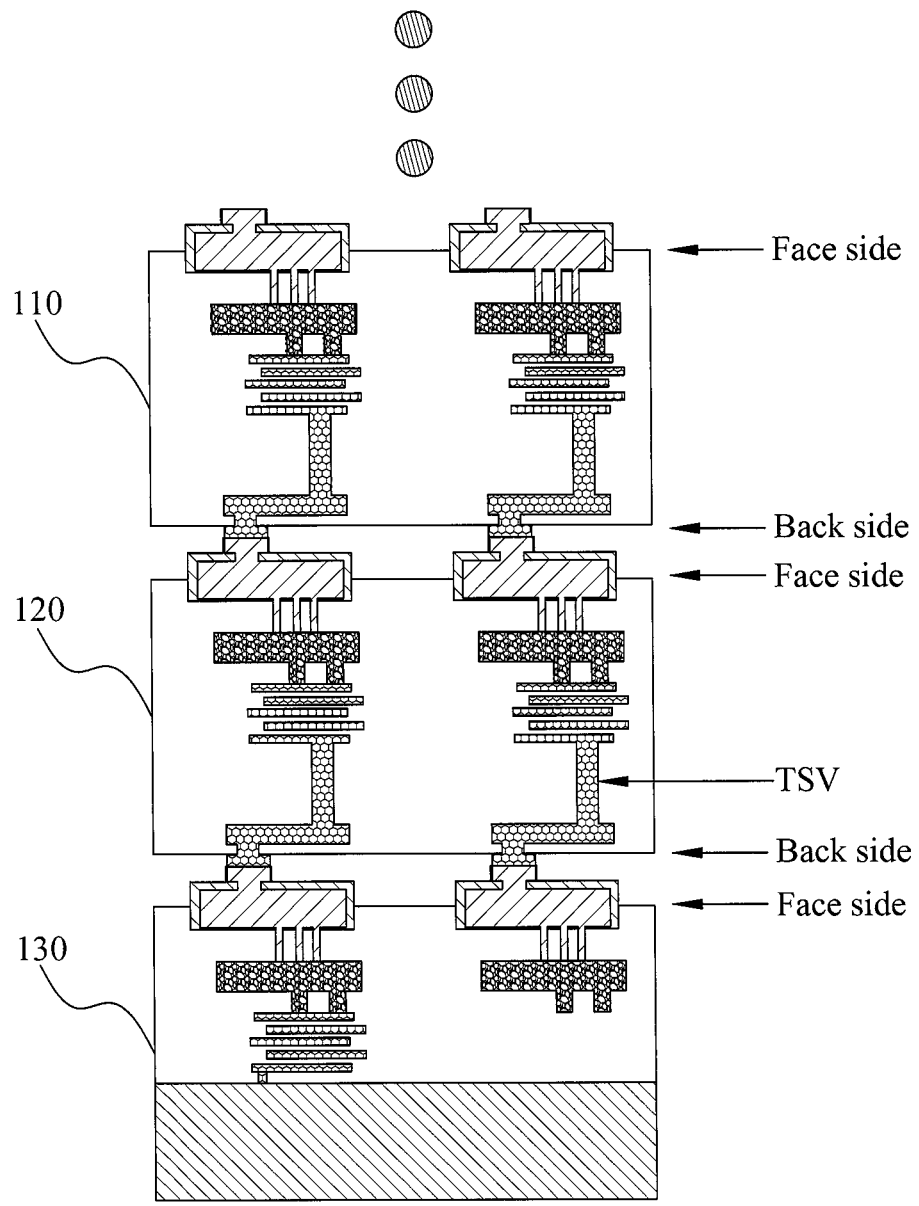
FIG. 1 shows a schematic view for a 3D wafer stacking.
Figure 2:
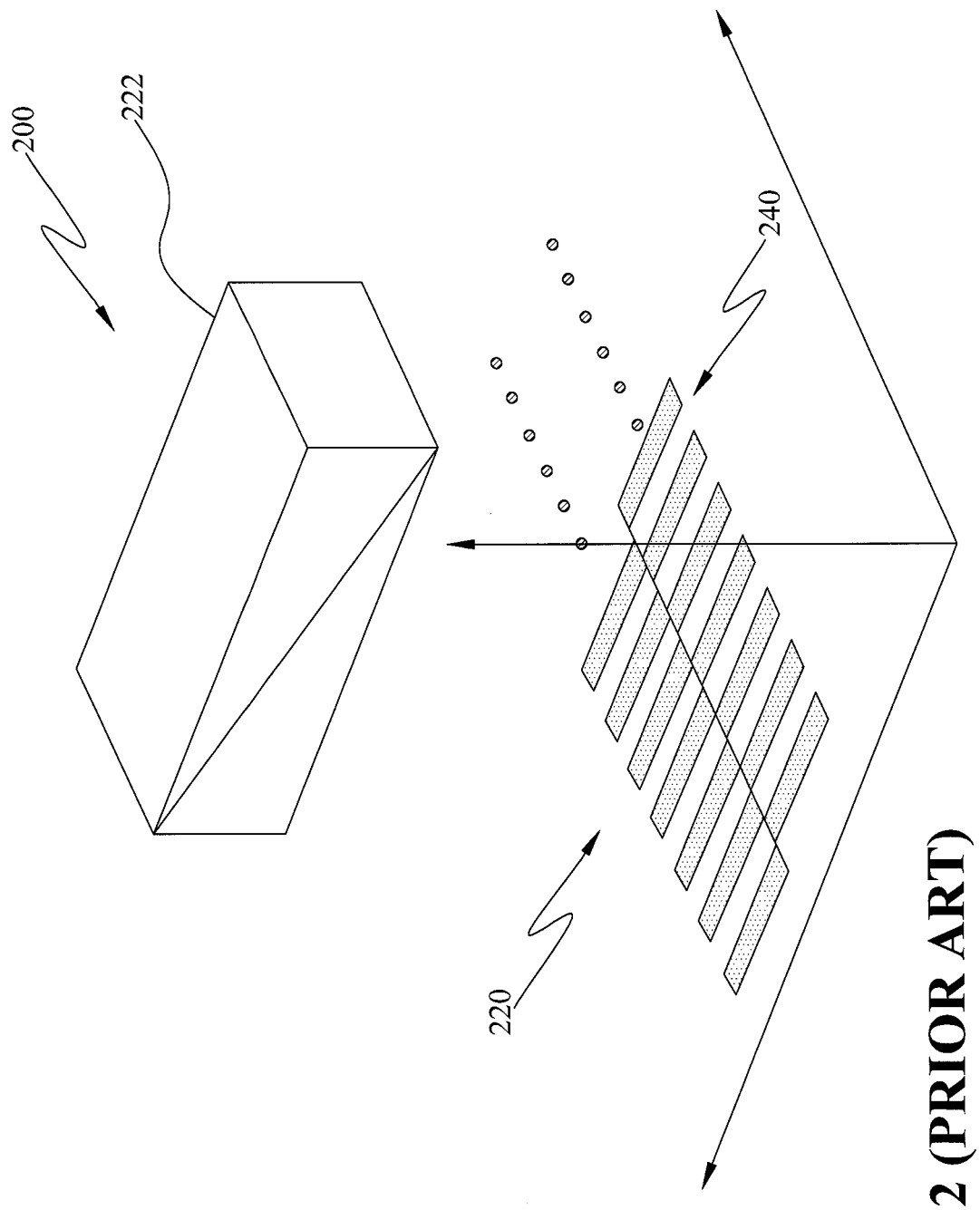
FIG. 2 shows a schematic view of an exemplary overlay mark.
Figure 3A:
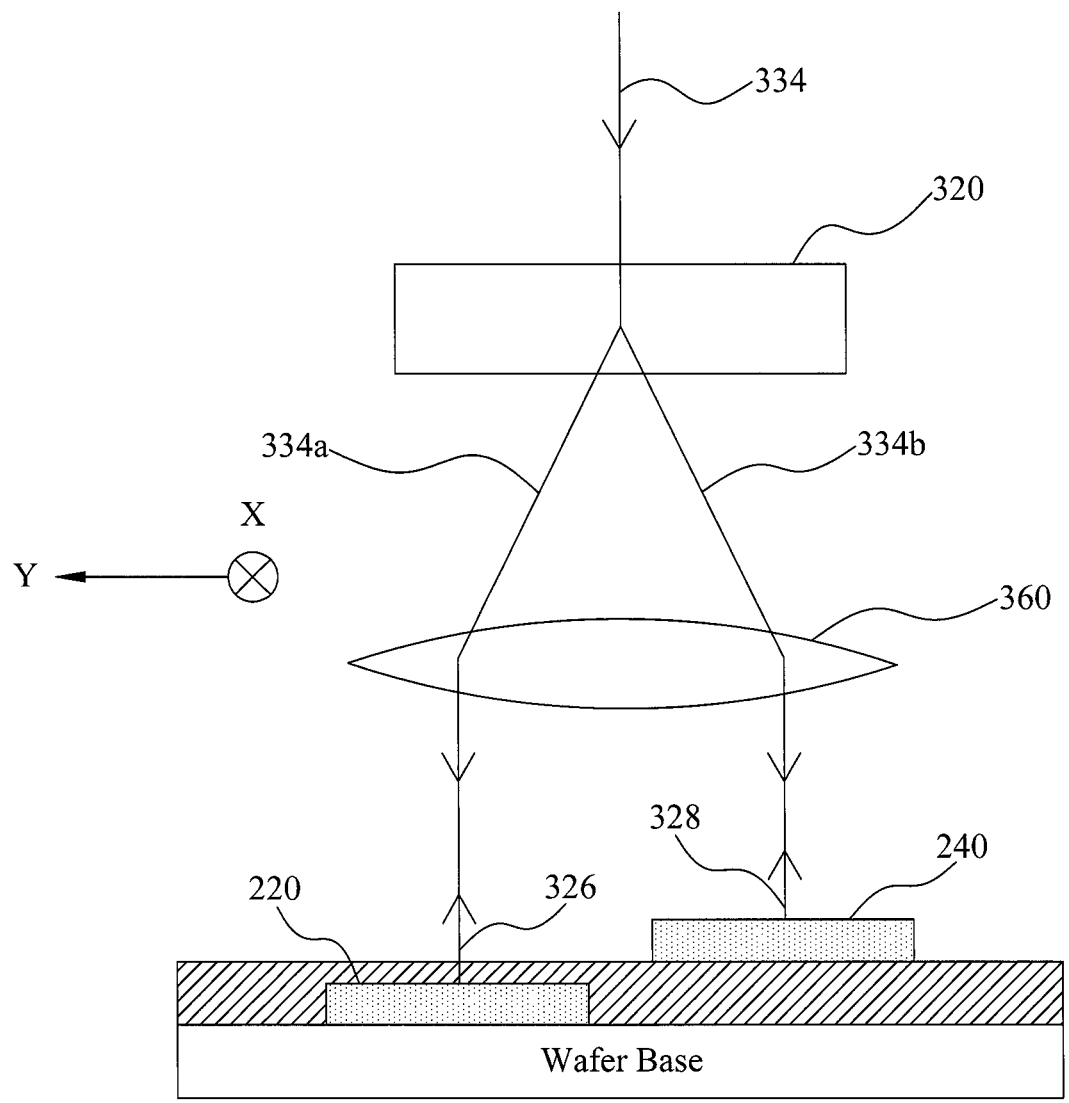
FIG. 3A shows an exemplary schematic view for an illumination light path of a measurement system.
Figure 3B:
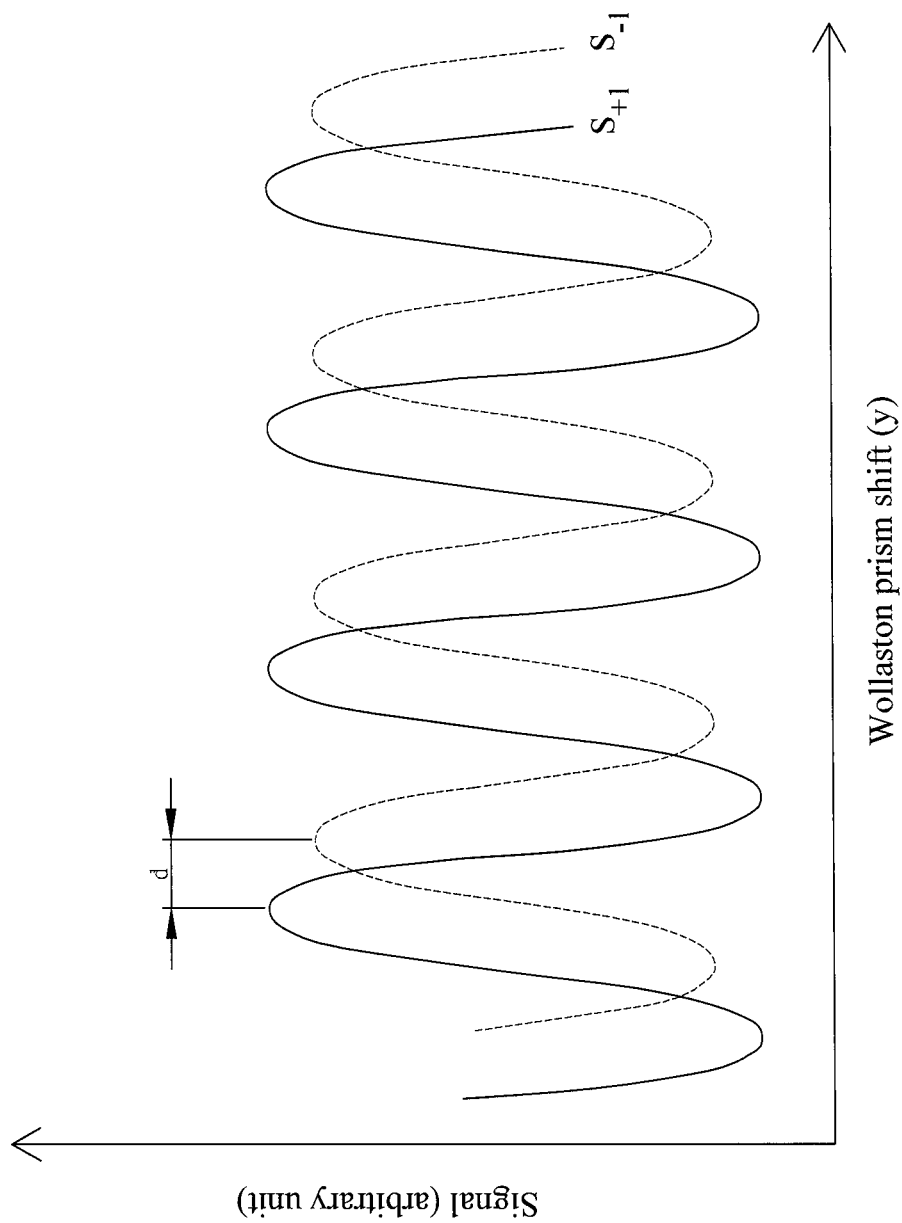
FIG. 3B shows a schematic view illustrating the variation of signal S+1 and signal S−1.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 4:
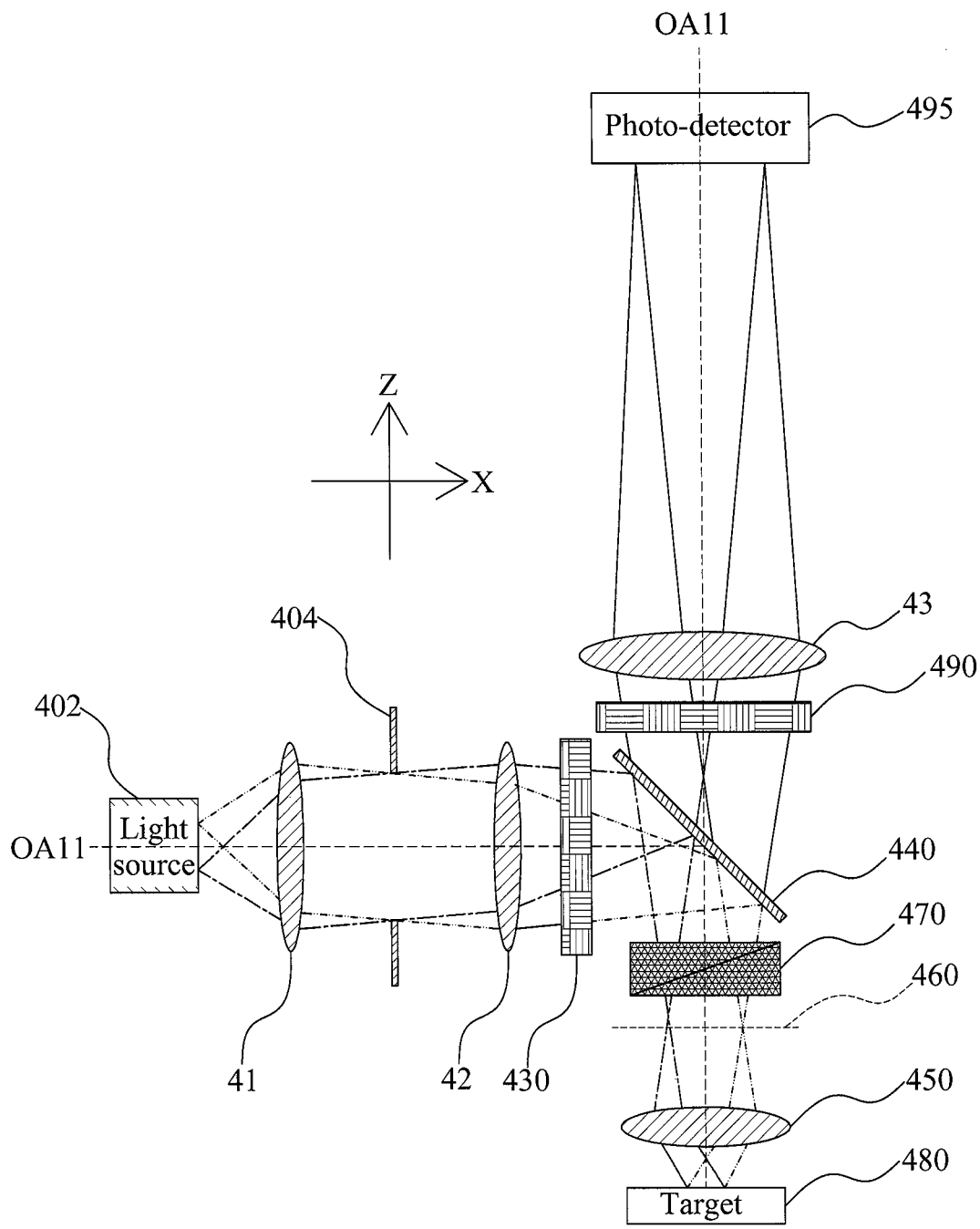
FIG. 4 shows a schematic view of the system architecture for a reflection-type differential interference microscope, according to an exemplary embodiment.

The disclosed exemplary embodiments of the technology for measuring a stacking overlay error use a differential interference contrast microscope as the tool for measuring a stacking overlay mark. When measuring a stacking overlay error, the exemplary embodiments focus on one overlay mark of a lower layer overlay mark and an upper layer overlay mark. The exemplary embodiments also provide an image analysis scheme to obtain the overlay error values of the low layer wafer and the upper layer wafer. The differential interference contrast microscope such as, but not limited to, a reflection-type differential interference contrast microscopy. FIG. 4 shows a schematic view of the system architecture for a reflection-type differential interference microscope, according to an exemplary embodiment.

As shown in the reflection-type differential interference contrast microscopy system of FIG. 4, a light source 402 has a wavelength greater than 900 nm, e.g. in the range between 900 nm and 1800 nm, is incident on a lens 41 and a lens 42, via a polarizer 430 to control polarization direction of the light, and a beam splitter 440 to change the traveling direction of the light, then the light source 402 focuses on a back focal plane 460 of an objective 450. A prism such as a Nomarski prism 470 is inserted between the beam splitter 440 and the back focal plane 460, so that the incident light having a single polarization direction on the X-Y plane is separated into an extraordinary ray (E-ray) and an ordinary ray (O-ray) via the objective 450 incident to a target 480.

The E-ray and the O-ray are scattered by the target 480 via the objective 450 and the Nomarski prism 470 to form two polarized lights perpendicular to each other on the polarization direction of the X-Y plane. After the two polarized lights are combined into a light through the interference of an analyzer 490, the light is incident on a photo-detector 495 via a lens 43. In the system, an aperture stop 404 may control the luminous flux of the incident light, wherein OA11 is the system optical axis.

Figure 5:
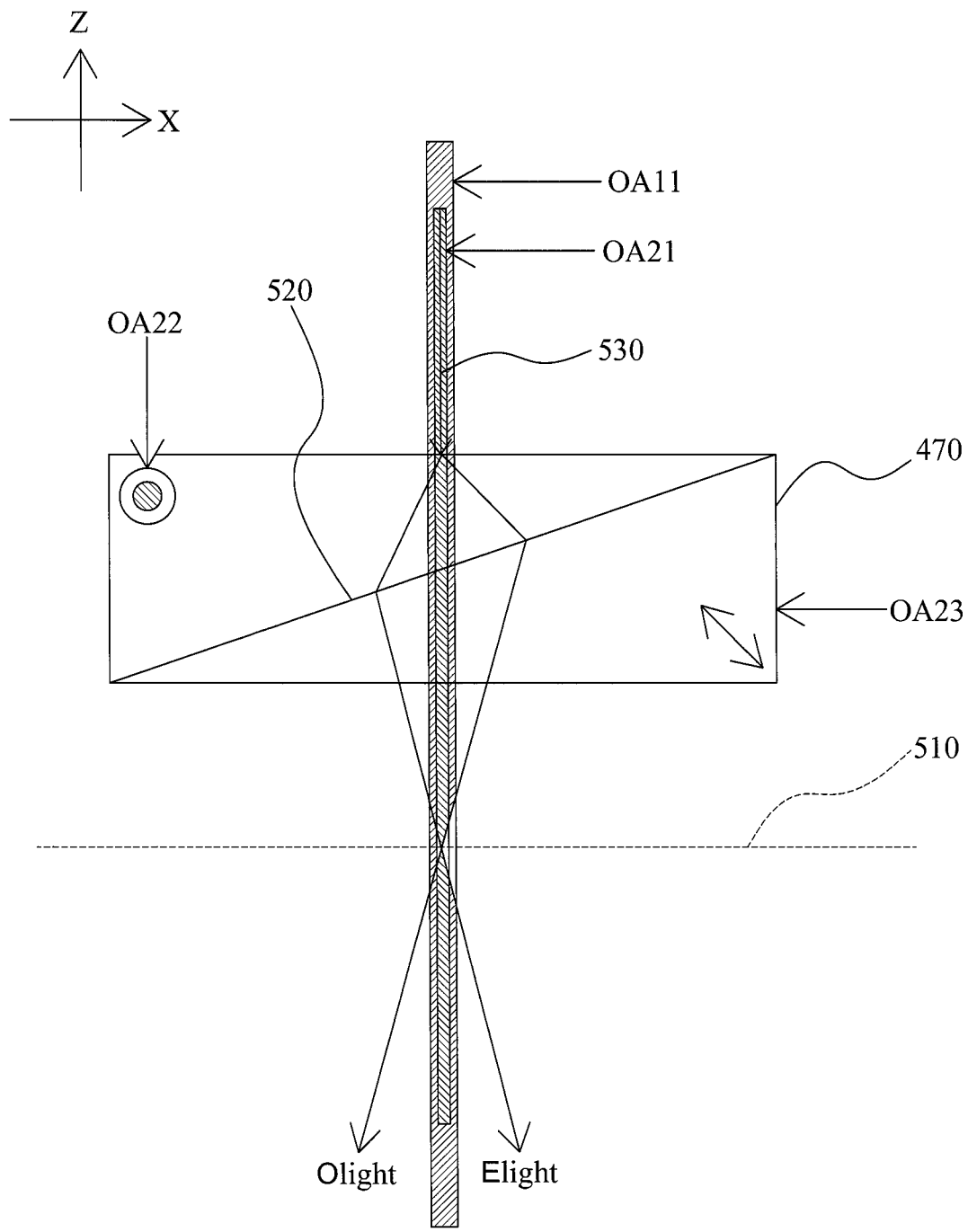
FIG. 5 shows a schematic view for an illumination light path of the Nomarski prism, according to an exemplary embodiment.
Figure 6:
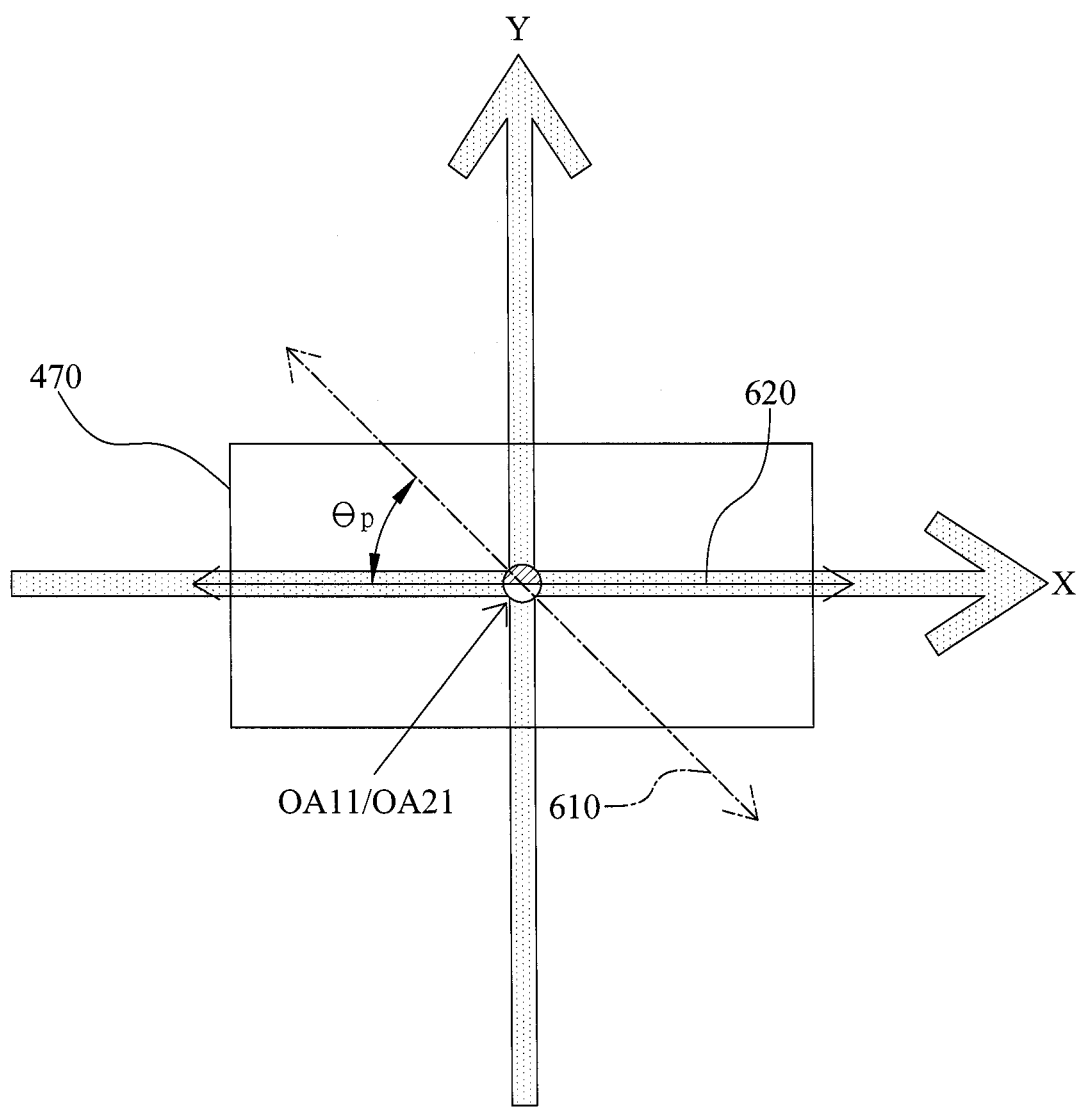
FIG. 6 shows a schematic top view of a Nomarski prism, according to an exemplary embodiment.

FIG. 5 shows a schematic view for an illumination light path of the Nomarski prism, according to an exemplary embodiment, wherein the reference OA11 represents the system optical axis of the differential interference contrast microscope; the reference OA21 represents the symmetry axis of the Nomarski prism 470. The references OA22 and OA23 respectively represent the crystal axis of the upper prism and the lower prism, and perpendicular to each other, wherein the upper prism and the lower prism are glued together on sides of both prisms. A linearly polarized light 530 incident on the Nomarski prism 470, is divided into E-ray and O-ray, and intersected into a point on an interference plane 510, and its split-light direction is the X-direction i.e., the direction of a prism bonding surface 520, called the shear axis. The shear axis is shown in FIG. 6. FIG. 6 shows a schematic top view of a Nomarski prism, according to an exemplary embodiment. In FIG. 6, $\theta_P$ is an angle between a direction of electric vector 610 of the linearly polarized light and a shear axis 620 of the Nomarski prism 470, and the angle $\theta_P$ may be controlled by the polarizer 430.

Figure 7:
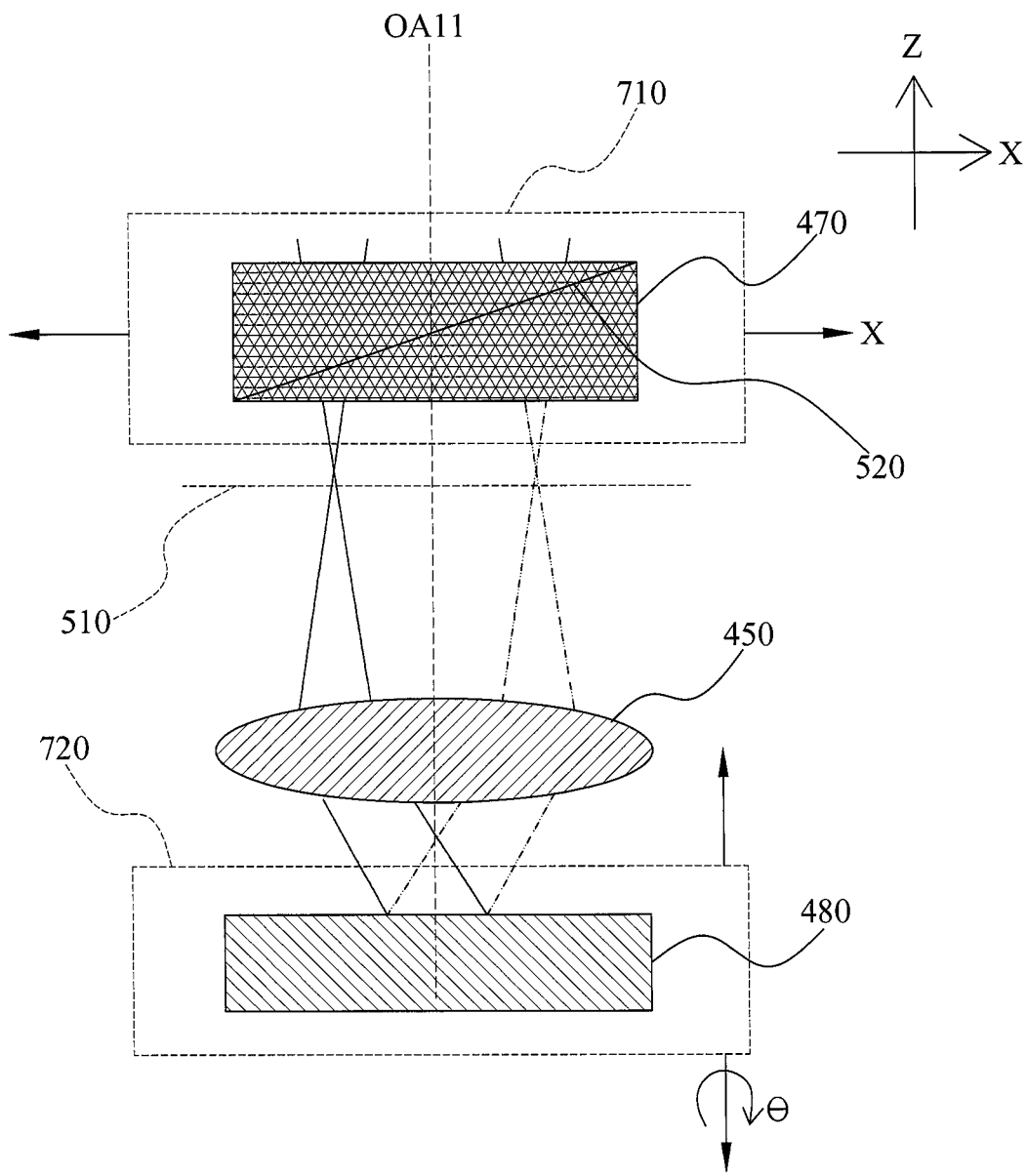
FIG. 7 shows a schematic view illustrating a configurable environment of a system for measuring a stacking overlay error, according to an exemplary embodiment.

According to the exemplary embodiments of the present disclosure, the differential interference contrast microscope system uses an illumination wavelength greater than 900 nm, and when the prisms is placed, the symmetry axis OA21 of the Nomarski prism 470 may be almost coincide with the optical axis OA11 of the differential interference contrast microscope system. The angle $\theta_P$ of the direction of electric vector 610 of the linearly polarized ray and the shear axis 620 of the Nomarski prism 470 is set to approximate to 45 degrees; and a polarization angle θs of a polarization analyzer 490 and the polarizer 430 is set to approximate to 90 degrees. That is, in the use of the reflection-type differential interference contrast microscope system, according to an exemplary embodiment, the system may be configured as shown in FIG. 7, which is described below.

(1) A platform (comprising a Nomarski prism) 710 moves along the X-direction, so the symmetry axis (OA21) of the Nomarski prism and the system optical axis (OA11) satisfy the following conditions:

$\psi \leq 0.1°$, $D \leq 1$ mm, when $\psi = 0°$, wherein ψ is an angle between the system optical axis OA11 and the symmetry axis OA21 of the prism. When ψ is equal to 0 degree, a distance d between the system optical axis OA11 and the symmetry axis OA21 is less than or equal to 1 mm. That is, the system optical axis OA11 is approximately coincident with the symmetry axis OA21 of the prism.

(2) A platform (containing an object) 720 moves along the Z direction, so that the measurement system focuses on one overlay mark of the upper layer overlay mark and the lower layer overlay mark. Furthermore, the platform 720 rotates with the Z direction, so that the angle θs between the shear axis 620 of the Nomarski prism and the symmetry axis of the overlay mark satisfies the following condition: 45°–2°≤θs≤45°+2°. That is, the angle θs between the shear axis 620 and the symmetry axis of the overlay mark is approximate to 45°, and the difference between the angle θs and 45° is not more than 2°.

According to the exemplary embodiments of the present disclosure, the differential interference contrast microscope system uses an illumination wavelength greater than 900 nm, and when the prisms is placed, the symmetry axis OA21 of the Nomarski prism 470 may be almost coincide with the optical axis OA1 of the differential interference contrast microscope system. The angle $\theta_P$ of the direction of electric vector 610 of the linearly polarized ray and the shear axis 620 of the Nomarski prism 470 is set to approximate to 45 degrees; and a polarization angle θs of a polarization analyzer 490 and the polarizer 430 is set to approximate to 90 degrees. That is, in the use of the reflection-type differential interference contrast microscope system, according to an exemplary embodiment, the system may be configured as shown in FIG. 7, which is described below.

(1) A platform (comprising a Nomarski prism) 710 moves along the X-direction, so the symmetry axis (OA21) of the Nomarski prism and the system optical axis (OA11) satisfy the following conditions:

$\psi \leq 0.1°$, $D \leq 1$ mm, when $\psi = 0°$, wherein ψ is an angle between the system optical axis OA11 and the symmetry axis OA21 of the prism. When ψ is equal to 0 degree, a distance d between the system optical axis OA11 and the symmetry axis OA21 is less than or equal to 1 mm. That is, the system optical axis OA11 is approximately coincident with the symmetry axis OA21 of the prism.

(2) A platform (containing an object) 720 moves along the Z direction, so that the measurement system focuses on one overlay mark of the upper layer overlay mark and the lower layer overlay mark. Furthermore, the platform 720 rotates with the Z direction, so that the angle θs between the shear axis 620 of the Nomarski prism and the symmetry axis of the overlay mark satisfies the following condition: 45°–2°≤θs≤45°+2°. That is, the angle θs between the shear axis 620 and the symmetry axis of the overlay mark is approximate to 45°, and the difference between the angle θs and 45° is not more than 2°.

Figure 8A:
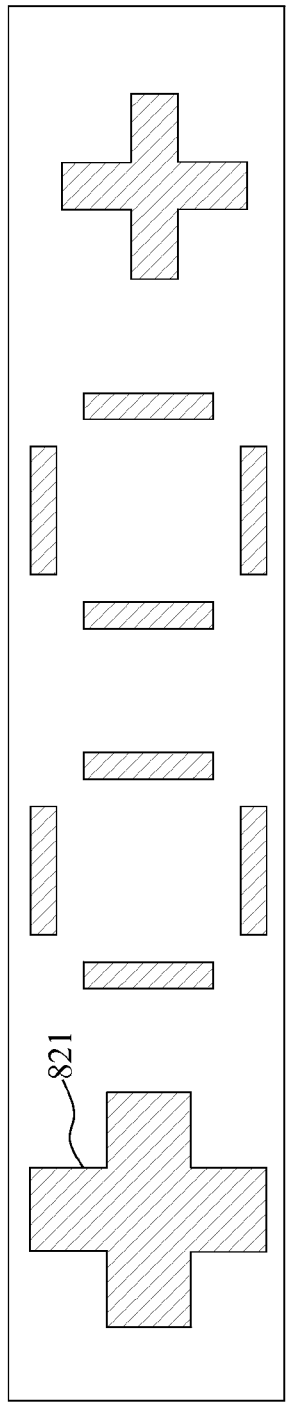
FIG. 8A and FIG. 8B show exemplary stacking overlay marks, according to an exemplary embodiment.
Figure 8B:
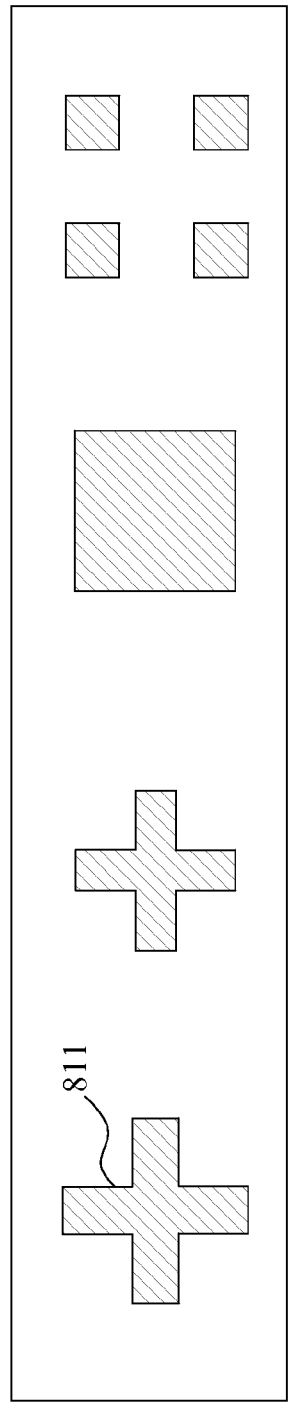
Figure 8C:
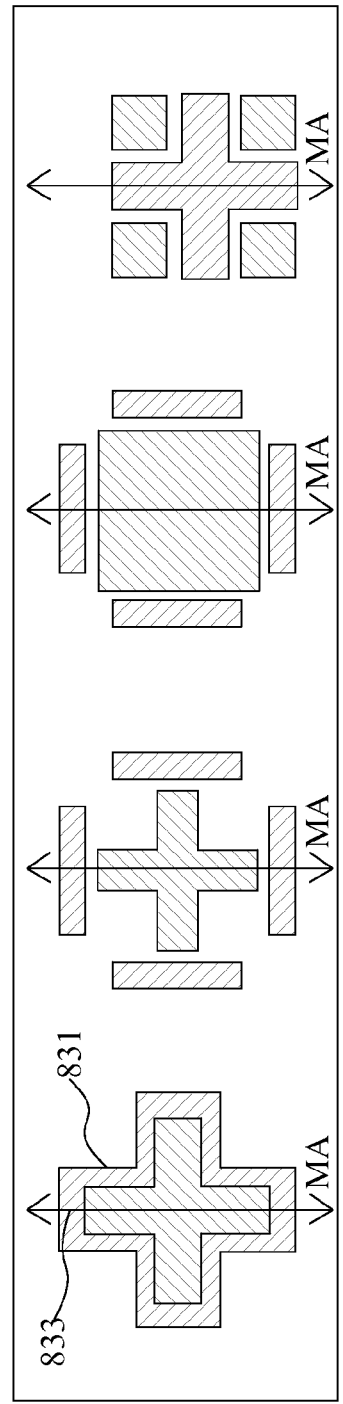
FIG. 8C shows a schematic view for an exemplary combination of the lower layer overlay marks and the upper layer overlay marks, according to an exemplary embodiment.

FIG. 8A and FIG. 8B show schematic views of common stacking overlay marks, according to an exemplary embodiment, wherein the stacking overlay marks of FIG. 8A and the stacking overlay marks of FIG. 8B are exemplars for the upper layer overlay marks and the lower layer overlay marks, respectively. When the upper wafer and the lower wafer are stacked together, according to an embodiment of the present disclosure, the overlay mark may use one of combinations of the lower layer overlay marks and the upper layer overlay marks such as an exemplar shown in FIG. 8C. FIG. 8C shows a schematic view for an exemplary combination of the lower layer overlay marks and the upper layer overlay marks, according to an exemplary embodiment. For example, a lower layer overlay mark 811 of FIG. 8B is an inner-cross mark, an upper layer overlay mark 821 of FIG. 8A is an outer-cross mark, and an overlay mark 831 in FIG. 8C is the lower layer overlay mark 811 in FIG. 8B added with the upper layer overlay mark 821 in FIG. 8A, and so forth. Given an overlay mark, according to an exemplary embodiment of the present disclosure, a symmetry axis of the overlay mark may be found, for example, for the symmetry axis of the overlay mark 831 in FIG. 8C, shown as a reference 833, its symmetry axis indicates that there is a mirror relationship between the mark at the left side and the mark at the right side.

Figure 9:
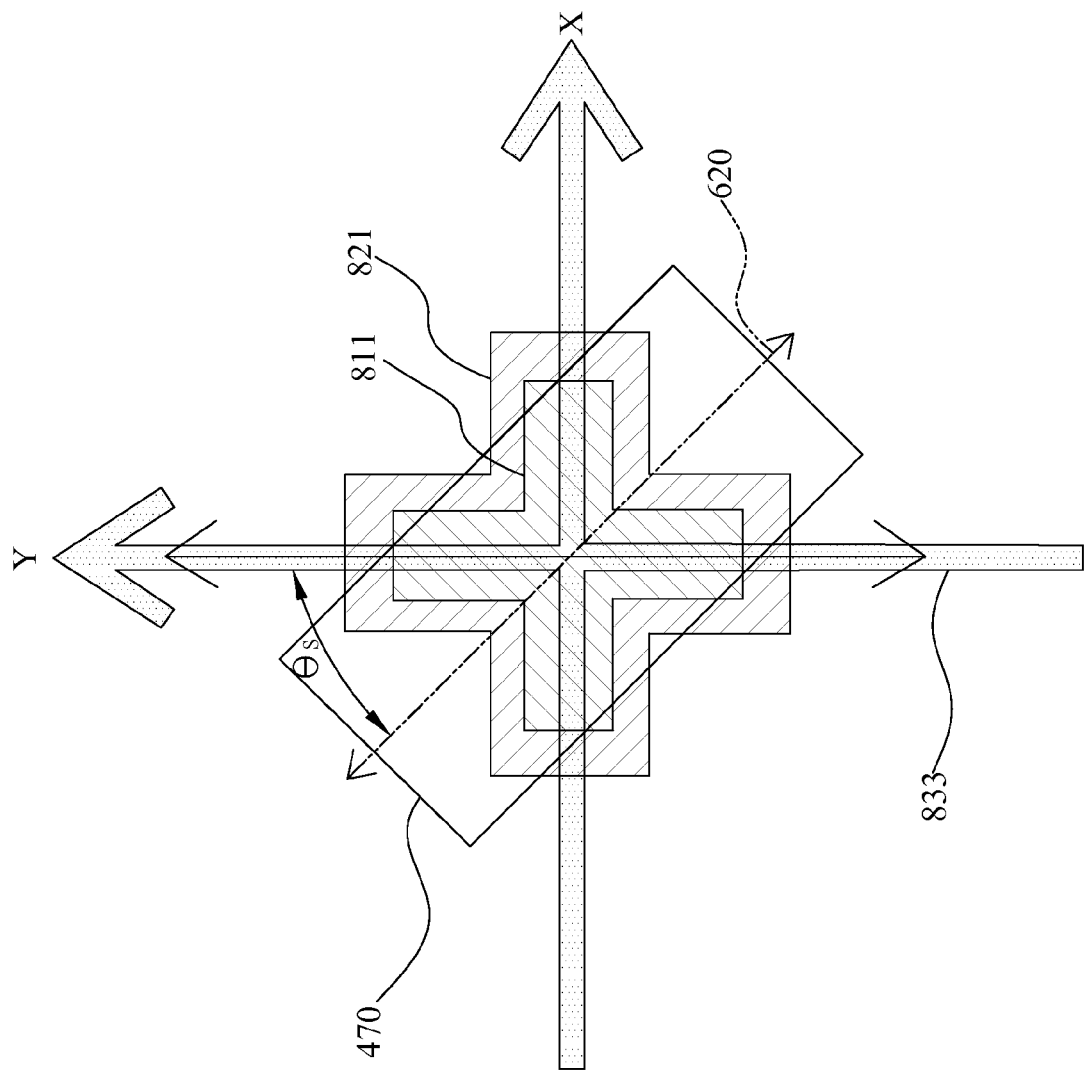
FIG. 9 shows a schematic view illustrating an azimuth of a stacking overlay mark in the measurement system, according to an exemplary embodiment.

When using differential interference contrast microscopy system for measuring a given stacking overlay mark, according to the disclosed exemplary embodiments, the azimuth of a stacking overlay mark in the measurement system may be shown as in FIG. 9. In the FIG. 9, the stacking overlay mark taking the overlay mark 831 as an example is described below. The overlay mark 831 is placed on the X-Y plane, and the symmetry axis 833 of the overlay mark 831 is approximately coincident with the Y axis, and the symmetry axis 833 intersects with the shear axis 620 of the prism 470 at the origin (0, 0) on the X-Y plane. The angle θs between the symmetry axis 833 of the overlay mark 831 and the shear axis 620 of prism 470 satisfies the previous condition, i.e., 45°–2°≤θs≤45°+2°. According to an exemplary embodiment of the present disclosure, when measuring, the differential interference contrast microscope only focuses on one layer overlay mark of the pre-described upper layer overlay mark and the lower layer overlay mark, thus it may analyze the stack overlay error from a measured image, such as exemplary embodiments of FIG. 10A to FIG. 10D.

Figure 10:
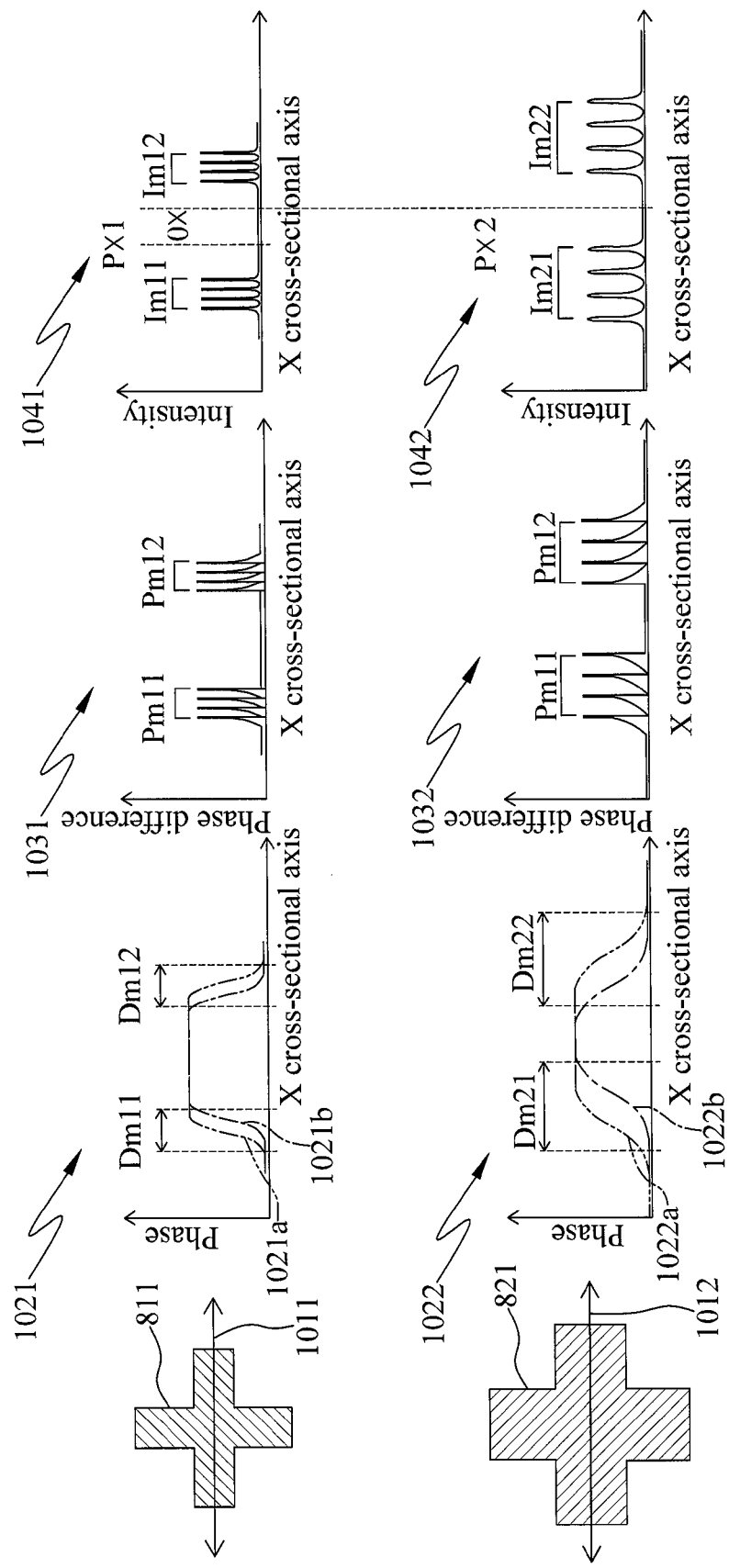
FIG. 10A shows a schematic view for analyzing the stacking error in the horizontal direction, according to an exemplary embodiment.
FIG. 10B shows phase distribution curves of the reflected ray when the incident light incident on the lower layer overlay mark and the upper layer overlay mark, according to an exemplary embodiment.
FIG. 10C shows phase difference distribution curves of the reflected ray when the incident light incident on the lower layer overlay mark and the upper layer overlay mark, according to an exemplary embodiment.
FIG. 10D shows intensity distribution curves of the reflected ray when the incident light incident on the lower layer overlay mark and the upper layer overlay mark, according to an exemplary embodiment.

In the exemplary embodiment of FIG. 10A to FIG. 10D, such as the overlay mark 831 is described below. As shown in FIG. 10A, the stacking error is analyzed in the horizontal direction, such as areas indicated by references 1011 and 1012. When the measurement system focuses on the lower layer overlay mark 811, it may be observed the incident light incident on the lower layer overlay mark 811 and the upper layer overlay mark 821 from the photo-detector 495. Thus the phase distribution, the phase difference distribution, and the intensity distribution of its reflected ray (E ray and O ray) on the photo-detector 495 are shown respectively in FIG. 10B, FIG. 10C, and FIG. 10D. FIG. 10B, FIG. 10C, and FIG. 10D are described as following.

FIG. 10B shows a schematic view for the phase distribution of the reflected light (E-ray and O-ray) when the incident light is incident on the lower layer overlay mark 811, according to an exemplary embodiment, wherein a curve 1021*a* is the phase distribution of the E-ray on the photo-detector; and a curve 1021*b* is the phase distribution of the O-ray on the photo-detector. Since there is an angle when E-ray and O-ray are respectively incident on the lower layer overlay mark 811, which makes a shift (i.e. a phase difference) on the phase-distribution of the E-ray and O-ray on the photo-detector. For example, in the upper FIG. 1021 of FIG. 10B, the lower layer overlay mark 811 has a respective shift on each of E-ray and O-ray in the region Dm11 and the region Dm12. Likewise, in the lower FIG. 1022 of FIG. 10B, when the incident light (E-ray and O-ray) are respectively incident on the upper layer overlay mark 821, from the phase distribution curve 1022*a* of the E-ray on the photo-detector and the phase distribution curves 1022*b* of the O-ray on the photo-detector, one may observe that the upper lower layer overlay mark 821 has a respective shift (phase difference) on each of E-ray and O-ray in the region Dm21 and the region Dm22, respectively.

FIG. 10C shows a schematic view for the phase difference distribution of the reflected ray when the incident light is incident on the lower layer overlay mark and the upper layer overlay mark, respectively, according to an exemplary embodiment. FIG. 10C converts the phase distribution in FIG. 10B into a phase difference distribution of 0 to $2\pi$. The region Pm11 and the region Pm12 in the upper FIG. 1031 of FIG. 10C may be obtained from the upper FIG. 1021 of FIG. 10B. The region Pm21 and the region Pm22 in the upper FIG. 1032 of FIG. 10C may be obtained from the upper FIG. 1022 of FIG. 10B. In FIG. 10C, when the phase difference is 0 or $2\pi$, the phenomenon is a constructive interference, so the light intensity is the maximum. Therefore, the intensity distribution of the reflected light (E-ray and O-ray) may be observed on the photo-detector, such as shown in FIG. 10D.

The image region Im11 and the image regional Im12 in the upper FIG. 1041 of FIG. 10D may be obtained from the upper FIG. 1031 of FIG. 10C. The image region Im21 and the image region Im22 in the lower FIG. 1042 of FIG. 10D may be obtained from the lower FIG. 1032 of FIG. 10C. In the upper FIG. 1041 of FIG. 10D, a center position Px1 of the lower layer overlay mark 811 may be calculated from the position of multiple peak values of the image regions Im11 and Im12. In the lower FIG. 1042 of FIG. 10D, using the same scheme, a center position Px2 of the upper layer overlay mark 821 may be calculated. Then, a shift Ox of the lower layer overlay mark 811 and the upper layer overlay mark 821 may be found through the center position Px1 and the center position Px2 in the horizontal direction, that is, the stacking overlay error in the horizontal direction is the shift Ox. Similarly, using the same analysis scheme, a shift Oy of the lower layer overlay mark 811 and the upper layer overlay mark 821 on the vertical direction may be found, that is, the stacking overlay error in the vertical direction is the shift Oy.

Figure 11:
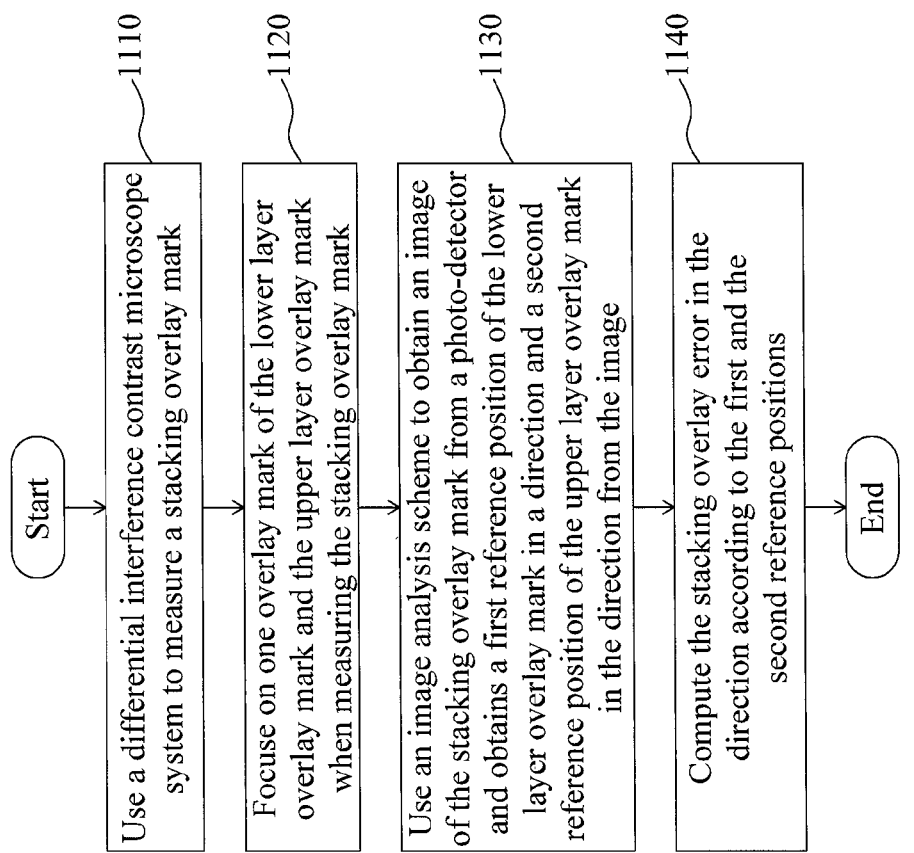
FIG. 11 shows a method for measuring a stacking overlay error, according to an exemplary embodiment.

Accordingly, FIG. 11 shows a method for measuring a stacking overlay error, according to an exemplary embodiment. As shown in FIG. 11, the method uses a differential interference contrast microscope system to measure a stacking overlay mark (step 1110), the stacking overlay mark such as is a combination of a lower layer overlay mark and an upper layer overlay mark. And the method focuses on one overlay mark of the lower layer overlay mark and the upper layer overlay mark when measuring the stacking overlay mark (step 1120). Then, the method uses an image analysis scheme to obtain an image of the stacking overlay mark from a photo-detector and obtains a first reference position (for example, a center position of the lower layer overlay mark) of the low layer overlay mark in a direction and a second reference position (for example, a center position of the upper layer overlay mark) of the upper layer overlay mark in the direction from the image (step 1130); and computes a stacking overlay error in the direction according to the first and the second reference positions (step 1140).

In step 1110, the differential interference contrast microscope system may be, but not limited to, a reflection-type differential interference contrast microscopy. In measuring the stacking overlay mark, the reflection-type differential interference contrast microscopy may be set as the configuration environment of FIG. 7, including such as the system optical axis OA11 and the symmetry axis OA21 of prism are approximately coincide, the illumination wavelength used by the differential interference contrast microscopy system is greater than 900 nm, and the angle $\theta$s between the symmetry axis of the overlay mark and the shear axis of the prisms is approximate to 45°. In step 1130, the image analysis scheme further includes using the image to analyze the phase distribution, the phase difference distribution, and intensity distribution of the reflected light in the direction when the incident light is incident on the lower layer overlay mark and the upper layer overlay mark, respectively. The exemplar is shown in FIGS. 10A to 10D. In step 1140, the stacking overlay error may be obtained through computing a shift of the first reference position and the second reference position in the direction. How to calculate the first reference position and the second reference position is not repeated here.

As previously described, when the actual stacking mark structure uses bright-field optical microscope measurements, since there is a thickness between the lower layer overlay mark and the upper layer overlay mark, for example, a thickness of 50 um, such that it is unable to simultaneously focus on the lower layer overlay mark and the upper layer overlay mark, so the image of the upper layer and the lower layer overlay marks are unable to be seen clearly at the same time, and thus it is difficult to analyze the stacking overlay error. The following is based on an actual stacking mark structure to calculate its stacking overlay error, according to the disclosed exemplary embodiments.

Figure 12A:
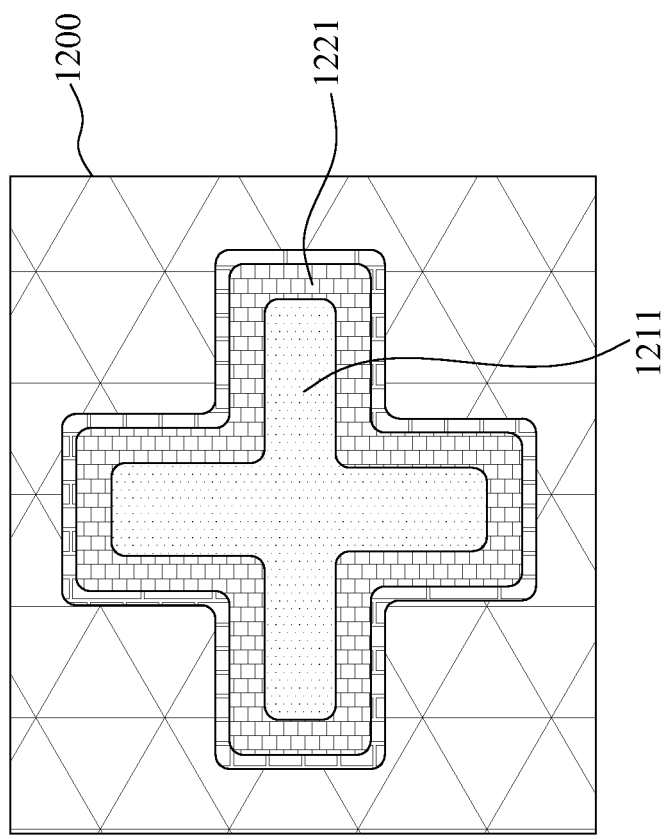
FIG. 12A shows a schematic view of an obtained image by using a reflection-type differential interference contrast microscopy focusing on the lower overlay mark, according to an exemplary embodiment.
Figure 12B:
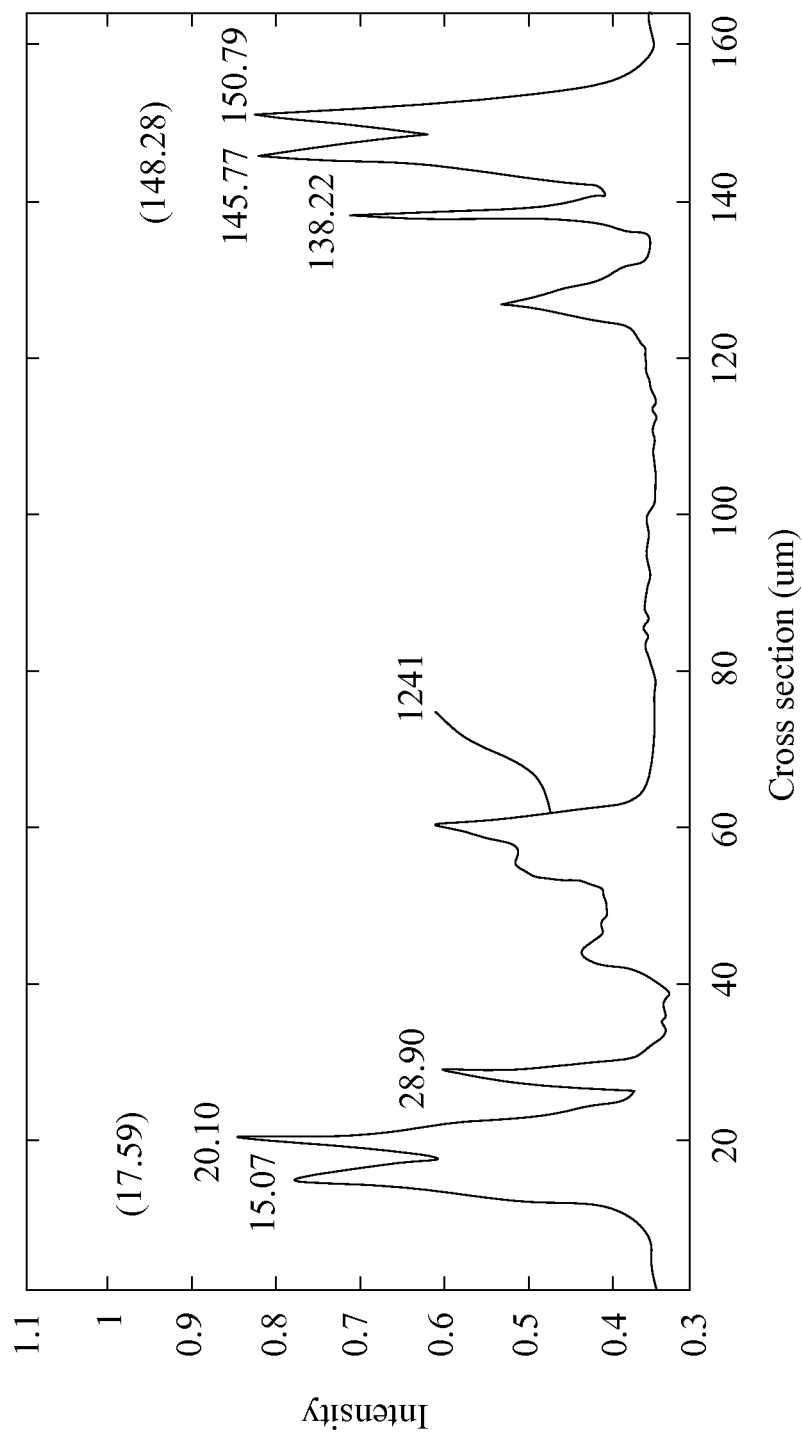
FIG. 12B and FIG. 12C show the intensity distribution curves of the reflected light on the photo-detector in X-direction and Y-direction respectively, when the light are respectively incident on the lower layer overlay mark and the upper layer overlay mark, according to an exemplary embodiment.
Figure 12C:
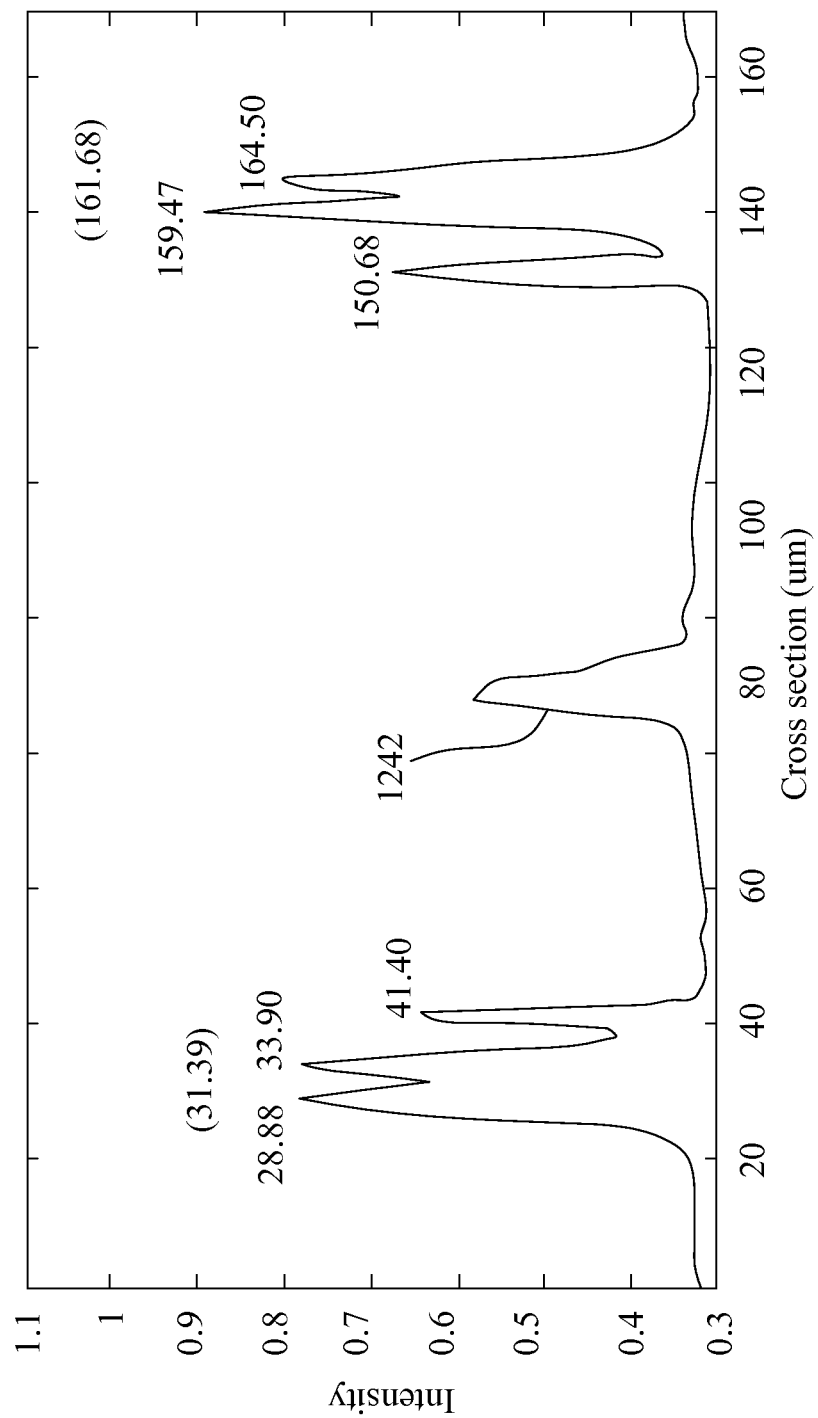

FIG. 12A shows a schematic view of an obtained image by using a reflection-type differential interference contrast microscopy focusing on the lower overlay mark, according to an exemplary embodiment. It may be seen from the image 1200 that the lower layer overlay mark 1211 has a single boundary apparently caused by the interference, while the upper layer overlay mark 1221 has a dual-boundary caused by the interference. Using the above-mentioned method to analyze the intensity distribution curves of the reflected light on the photo-detector in X-direction and Y-direction respectively, when the light are respectively incident on the lower layer overlay mark 1211 and the upper layer overlay mark 1221, such as shown in FIG. 12B and FIG. 12C respectively. In FIG. 12B, from the intensity distribution curve 1241 on the X direction, one may obtain the left and the right borders of the lower layer overlay mark 1211 are 28.9 um and 138.22 um, respectively. Therefore, the center position of the lower layer overlay mark 1211 in the X-direction is equal to (8.9 um+138.22 um)/2, i.e. 83.56 um; while the left boundary of the upper layer overlay mark 1221 having two positions with peak values 15.07 um and 20.10 um, respectively; therefore the obtained center position of the left border of the upper right overlay mark 1221 is equal to (15.07 um+20.10 um)/2, i.e. 17.59 um. Likewise, the obtained center position of the right border is equal to (145.77 um+150.79 um)/2, i.e. 148.28 um; with the center position 17.59 um of the left border and the center position 148.28 um of the right border. The center position of the upper layer overlay mark may be obtained as (17.59 um+148.28 um)/2, i.e. 82.93 um. Therefore, the stack overlay error on the X-direction is equal to the gap between the center position of the lower layer overlay mark 1211 and the center position of the upper layer overlay mark 1221 in the X direction, i.e. 83.56 um-82.93 um. Thus the stacking overlay error in the X direction is 0.63 um. Likewise, in FIG. 12C, the intensity distribution curve 1242 in the Y-direction may be analyzed, and then the obtained center position of the lower layer overlay mark 1211 in the Y-direction is (41.40 um+150.68 um)/2, i.e. 96.04 um; While the center position of the upper layer overlay mark 1221 in the Y-direction is (31.39 um+161.98 um)/2, i.e. 96.69 um; therefore, the stacking overlay error in the Y-direction is 96.69 um-96.04 um, i.e. 0.65 um.

Figure 13:
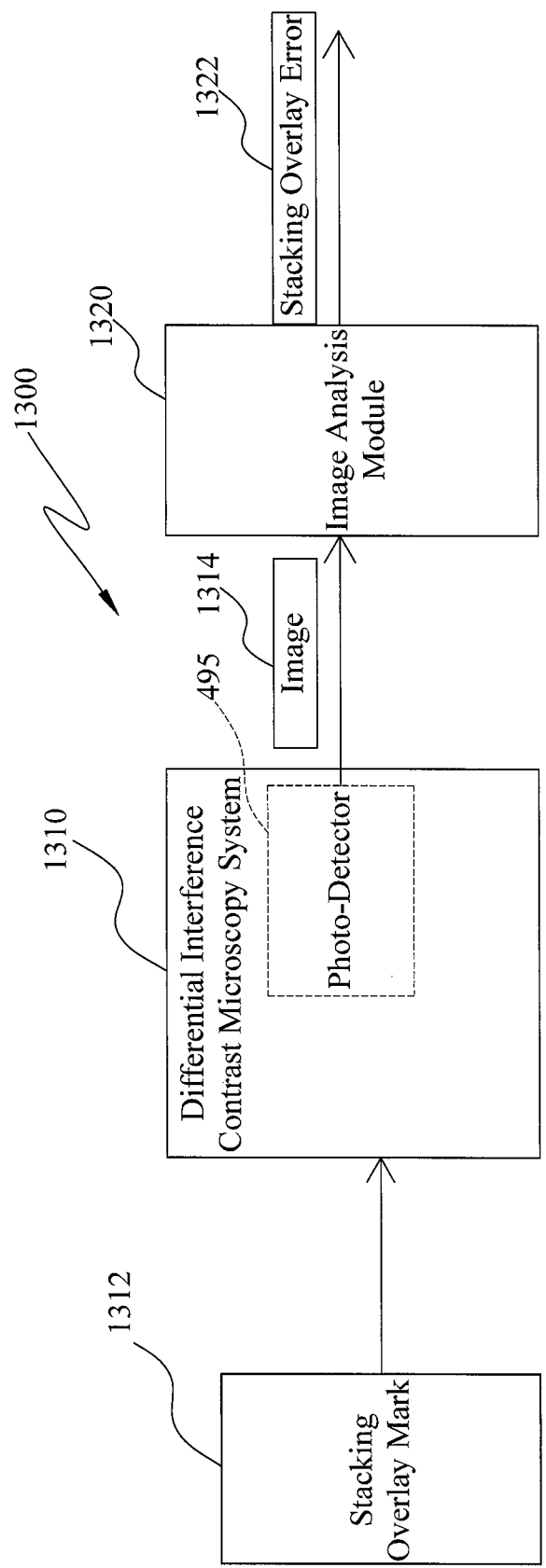
FIG. 13 shows a schematic view of a system for measuring a stacking overlay error, according to an exemplary embodiment.

Accordingly, FIG. 13 shows a schematic view of a system for measuring a stacking overlay error, according to an exemplary embodiment. Refer to FIG. 13, a system for measuring a stacking overlay error 1300 may comprise a differential interference contrast microscope system 1310 and an image analysis module 1320. The differential interference contrast microscope system 1310 is configured to measure a stacking overlay mark 1312. The image analysis module 1320 obtains an image 1314 of a stacking overlay mark 1312 from the photo-detector 495, and analyzes a first reference position of a low layer overlay mark in a direction and a second reference position of an upper layer overlay mark in the direction from the image, and computes a stacking overlay error 1322 in the direction according to the first and the second reference positions. The differential interference contrast microscopy system 1310 has a special configuration as shown in FIG. 7. This special configuration has been described in the pre-mentioned exemplary embodiments, and is not repeated here. When measuring the stacking overlay mark, the differential interference contrast microscopy system 1310 only focuses on one overlay mark of a lower layer overlay mark and an upper layer overlay mark. How the image analysis module 1320 performs the image analysis has been described in the pre-mentioned exemplary embodiments, and is not repeated here.

In summary, the exemplary embodiments of present disclosure provide a method and system for measuring a stacking overlay error. This technology uses a differential interference contrast microscopy system as a tool for measuring a stacking overlay mark, focuses on one overlay mark of a lower layer overlay mark and an upper layer overlay mark, and uses an image analysis scheme to obtain the stacking overlay error of the upper layer wafer and the lower layer wafer from the image of the stacking overlay mark. The exemplary embodiments of present disclosure may be applied on such as three-dimensional integrated circuit testing equipments.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for measuring a stacking overlay error of a stacking overlay mark using a differential interference contrast microscope system equipped with a Nomarski prism, the stacking overlay mark being a combination of a lower layer overlay mark and an upper layer overlay mark, the method comprising:
    moving the Nomarski prism in an X direction so that a symmetry axis of the Nomarski prism is substantially coincident with a system optical axis of the differential interference contrast microscope system in a Z direction;
    rotating the stacking overlay mark with respect to an axis in the Z direction so that an angle between a symmetry axis of the stacking overlay mark in a Y direction and a shear axis of the Nomarski prism is approximately 45 degrees;
    focusing an illumination light that passes through the Nomarski prism on either the lower layer overlay mark or the upper layer overlay mark to form an image of the stacking overlay mark;
    using a photo-detector to acquire the image of the stacking overlay mark and obtaining a first reference position of the lower layer overlay mark in the X direction and a second reference position of the upper layer overlay mark in the X direction from the image; and
    computing the stacking overlay error in the X direction according to the first and the second reference positions;
    wherein the X, Y and Z directions are three orthogonal directions in a three-dimensional coordinate system, and the lower and upper layer overlay marks are located on two different X-Y planes.

2. The method as claimed in claim 1, wherein obtaining said first reference position is accomplished by obtaining a first center position of said lower layer overlay mark, and obtaining said second reference position is accomplished by obtaining a second center position of said upper layer overlay mark.

3. The method as claimed in claim 1, wherein the step of computing the stacking overlay error further includes:
    using said image for analyzing a phase distribution, a phase difference distribution, and an intensity distribution of said lower layer overlay mark and said upper layer overlay mark in said image.

4. The method as claimed in 1, wherein said stacking overlay error is computed based on a shift between said first reference position and said second reference position.

* * * * *